(12) United States Patent
Lujan et al.

(10) Patent No.: US 7,973,311 B2
(45) Date of Patent: Jul. 5, 2011

(54) ISOLATED SENSOR STRUCTURES SUCH AS FOR FLEXIBLE SUBSTRATES

(75) Inventors: Rene Lujan, Sunnyvale, CA (US); William S. Wong, San Carlos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 422 days.

(21) Appl. No.: 12/130,261

(22) Filed: May 30, 2008

(65) Prior Publication Data

US 2009/0294767 A1    Dec. 3, 2009

(51) Int. Cl.
*H01L 31/0376* (2006.01)
*H01L 31/18* (2006.01)

(52) U.S. Cl. ....... 257/57; 257/59; 257/71; 257/E31.047; 257/E27.133; 257/E31.079; 438/57

(58) Field of Classification Search .............. 257/57, 257/59, 71, 444, E27.133, E31.047, E27.131, 257/E27.146, E31.079; 438/22, 48, 57, 149; 250/208.1, 370.09; 359/296
See application file for complete search history.

(56) References Cited

U.S. PATENT DOCUMENTS

| | | | |
|---|---|---|---|
| 5,619,033 A | 4/1997 | Weisfield | |
| 5,648,674 A | 7/1997 | Weisfield et al. | |
| 6,348,693 B1 | 2/2002 | Weisfield et al. | |
| 6,717,152 B2 | 4/2004 | Izumi | |
| 6,856,670 B2 | 2/2005 | Hoheisel | |
| 7,078,702 B2 | 7/2006 | Ringermacher et al. | |
| 7,265,327 B1 | 9/2007 | Park et al. | |
| 2008/0012469 A1* | 1/2008 | Park et al. | 313/500 |

* cited by examiner

*Primary Examiner* — Victor Mandala
*Assistant Examiner* — Whitney Moore
(74) *Attorney, Agent, or Firm* — Jonathan A. Small

(57) ABSTRACT

A photosensor structure includes a pixel metal layer disposed in physical and electrical contact with a pixel thin film transistor and a lower sensor layer of a p-i-n photosensor. The pixel metal layer extends laterally to an extent less that the lower sensor layer such that an overhang region is defined below the lower sensor layer and the adjacent the lateral edge of the pixel metal layer. When the relatively thick intrinsic sensor layer is formed over the lower sensor layer, it attaches to the upper surface and, due to the presence of the overhang region, the lateral edge of the lower sensor layer, forming a discrete intrinsic sensor layer structure over the pixel which is physically isolated from adjacent corresponding structures. This isolation allows for thermal expansion and contraction during formation of the intrinsic sensor layer without cracking the intrinsic sensor layer structure.

21 Claims, 8 Drawing Sheets

ISOLATED SENSOR STRUCTURES SUCH AS FOR FLEXIBLE SUBSTRATES

STATEMENT REGARDING FEDERALLY SPONSORED RESEARCH AND DEVELOPMENT

Work related to this disclosure was performed with the support of U.S. Government under contract number 70NANB3H3029 awarded by the United States Department of Commerce, National Institute of Standards and Technology (NIST). Therefore, the U.S. Government has certain rights herein.

CROSS REFERENCE TO RELATED CASES

The present disclosure relates to U.S. patent application Ser. No. 12/130,347, titled "Self-Aligned Thin-Film Transistor And Method Of Forming Same", filed May 30, 2008, which is incorporated by reference herein and to which priority is hereby claimed.

BACKGROUND

The present disclosure is related to radiation sensors, and more specifically to such sensors formed on a flexible substrate.

Conventional large-area thin-film sensors comprise an array of addressable pixels covered by a continuous layer of radiation-sensitive material. The radiation-sensitive material typically generates photons in the region in which radiation (e.g., x-rays) is incident thereon. These photons are converted into a charge and delivered to pixel(s) below the point of incidence of the radiation. The charge may then be read out from each pixel, and the extent and location of the incidence of radiation thereby determined. One example of such a sensor may be found in U.S. Pat. No. 5,619,033, which is herein incorporated by reference.

Typically, sensor arrays and the overlying sensor layer are formed on a rigid substrate such as glass. However, increasingly there is a desire for such sensor arrays to be provided on a flexible substrate such as sheet plastic. When formed on a flexible substrate, conformal sensor arrays may then be provided. However, there are a number of manufacturing challenges when forming devices on flexible substrates, particularly plastics. One such challenge is the thermal expansion coefficient mismatch between the plastic substrate and the materials deposited thereon. The difficulties introduced by this mismatch significantly increase as the thickness of the layer(s) deposited on the substrate increase.

For example, while typical thin-film transistor (TFT) stacks are quite thin, typical radiation sensor layers are relatively very thick, on the order of 1 µm (micrometer) or more in thickness. When fabricated over a plastic substrate, this relatively thick layer exhibits cracking and delamination due to the difference in thermally-induced expansion and contraction between the plastic substrate and the sensor layer material. This cracking and delamination results in poor device performance and high rates of device failure.

Therefore, there is a need in the art for a method of producing a radiation sensor structure on a flexible substrate with improved accommodation for the thermal mismatch between the substrate and the sensor structure materials and processes. More particularly, there is a need in the art for a structure and method of producing that structure consistent with the materials and processing steps currently used to produced sensor devices yet is significantly more tolerant of the thermal mismatch between substrate and sensor layer than current structures and methods for producing them.

SUMMARY

Accordingly, the present disclosure is directed to a TFT sensor structure and method for providing that structure which may be produced over a flexible substrate using many standard sensor materials and processing steps yet which exhibits significantly reduced failures due to thermal mismatch between substrate and sensor layer. Specifically, the present disclosure provides the advantage of being able to pattern an overlying layer without special added processing steps. Isolated island structures may be produced which include relatively thick film layers. Gaps formed between the isolated, or discontinuous island structures act as strain relief regions to accommodate thermally-induced expansion and contraction during manufacturing, and provide a free surface at which crack propagation may terminate.

According to one aspect of the disclosure a structure is provided which comprises a flexible substrate onto which is formed a TFT backplane with an encapsulation layer formed thereover. The encapsulation layer has a plurality of individual, patterned pixel metal regions (referred to as "mushroom metal" regions) formed thereover, which are in electrical communication with the TFT backplane by way of a via formed in the encapsulation layer.

A first doped sensor layer, such as the n-type layer of the p-i-n junction sensor structure, is patterned over each mushroom metal region such that for each pixel at least one lateral edge of the patterned doped sensor layer for that pixel extends beyond a corresponding lateral edge of the mushroom metal region for that pixel, thereby defining an overhang region. An intrinsic (undoped) sensor layer is deposited such that it extends over the upper surface of the first doped sensor layer and onto a least a portion of at least one of the lateral edges of the first doped sensor layer. In so doing, the undoped sensor layer forms a discrete structure, physically (and electrically) separated from its neighboring pixel structures. This separation reduces or even eliminates expansion- and contraction-induced cracking during deposition of the undoped layer. Optionally, in the process of depositing the undoped sensor layer, material may accumulate in the interstitial regions between adjacent pixels, forming a field sensor region. Finally, a second doped sensor layer such as the p-type layer of the p-i-n junction sensor structure, is deposited over the undoped layer, and a contact layer deposited over the second doped sensor layer.

According to another aspect of the present disclosure, a method is provided according to which a mushroom metal layer is deposited and patterned into pixel regions over an encapsulated TFT backplane formed on a flexible substrate. A first doped sensor layer is deposited thereover. The first doped sensor layer is then patterned such that at least one of its lateral edges extend beyond the corresponding lateral edge(s) of the patterned mushroom metal layer to define an overhang region. Typically, the pixels will be formed in an array having rows and columns of adjacent pixels. Each pixel will be provided with a discrete region of mushroom metal and a first doped sensor layer, and the lateral edges at which the overhang regions are defined are the lateral edges facing adjacent pixels. The overhang region may, for example, be defined by the difference in etching rates between the mushroom metal and the first doped sensor layer. Alternatively, the mushroom metal layer may itself be a bi-layer structure, and the overhang region may be defined by the difference in etching rates between the metals comprising the mushroom metal layer.

A relatively thick, undoped sensor layer structure is then deposited over the first doped sensor layer such that it covers the top surface and at least a portion of a lateral edge(s) of the first doped sensor layer. For each pixel, this undoped sensor layer structure is, as deposited, physically discrete from the undoped sensor layer structures associated with adjacent pixels. Thermal expansion and contraction of the substrate and various layers of the device being fabricated can then be accommodated without cracking of the relatively thick, undoped sensor layer.

Deposition processes are performed at a relatively high temperature, causing expansion of the materials, including the substrate. The aforementioned gap may therefore provide a strain relief region to accommodate thermally-induced expansion and contraction and provide a free surface at which crack propagation may terminate.

The above is a summary of a number of the unique aspects, features, and advantages of the present disclosure. However, this summary is not exhaustive. Thus, these and other aspects, features, and advantages of the present disclosure will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION

Figure 1:
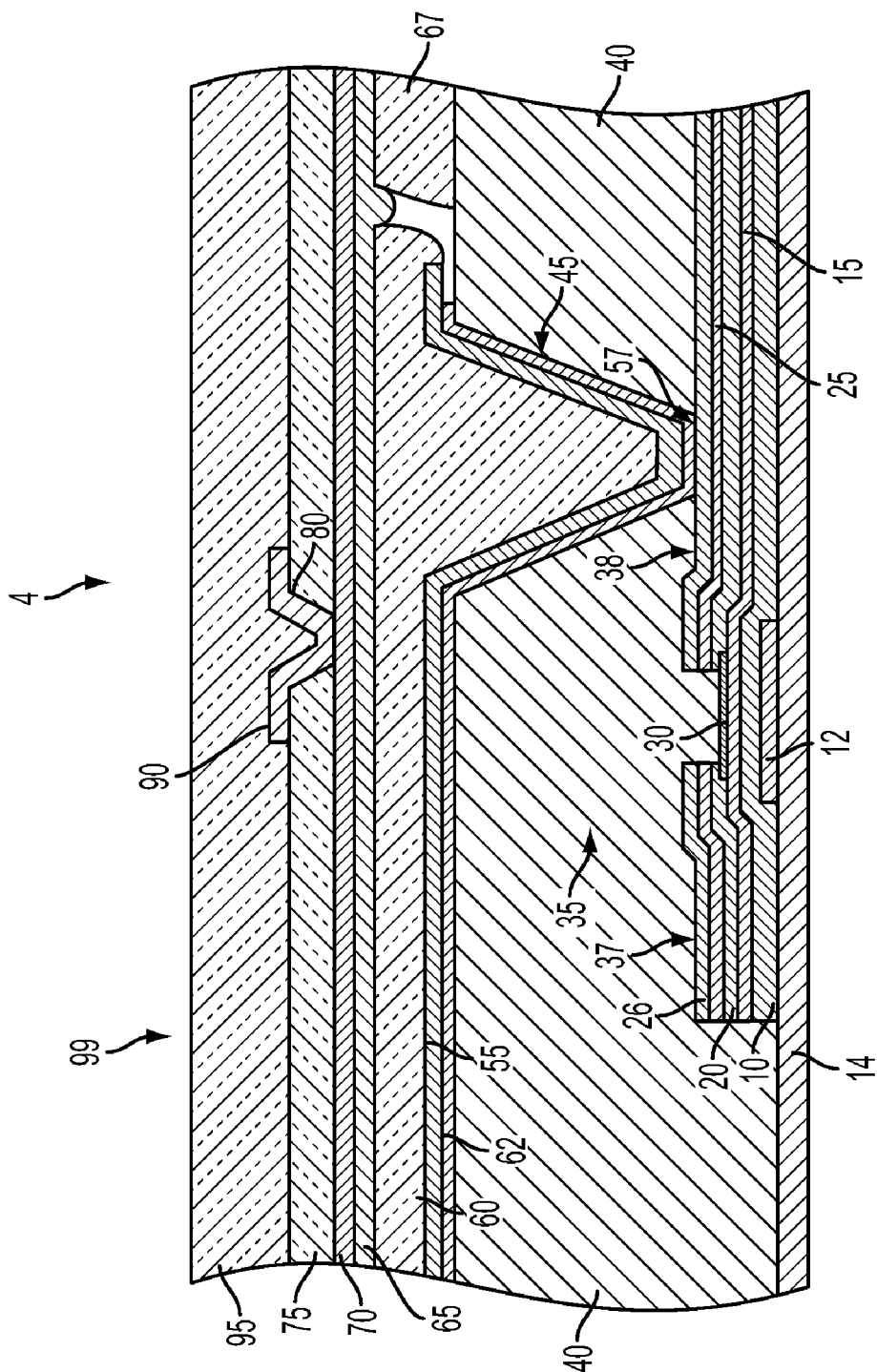
FIG. 1 is a cross-sectional view of a first embodiment of a photo-sensor structure according the present disclosure.

With reference to FIG. 1, there is shown therein a first embodiment of a photosensor structure 4 which includes a thin-film field effect transistor (TFT) 35. While the actual composition and arrangement of TFT 35 may vary without departing from fundamental concept of the present disclosure, in one example TFT 35 comprises a metal gate electrode 12 formed on a substrate 14. The metal comprises refractory metals, such as a titanium-tungsten (TiW) layer, about 1200 Å (angstroms) thick covering an Al layer about 800 Å thick. Other refractory metals like Cr, Mo, or Ta, are suitable alternatives. A gate dielectric layer 10 of silicon nitride (SiNx) about 3000 Å thick is formed over the gate electrode and the substrate 5. A layer of hydrogenated amorphous silicon (a-Si: H) 15 which is about 300 Å to about 500 Å thick is formed over the gate dielectric layer 10.

An etch stopper 30 is formed from a layer of SiNx about 1500 Å thick over an a-Si:H layer 15 above the gate electrode 12. An n+ layer 20 which is about 500 Å to about 1000 Å thick is formed over the a-Si:H layer 15 and partially over the etch stopper layer 30. A TiW metal layer 25 which is about 500 Å thick is formed over the n+ layer 20 and an Al layer 26 which is about 0.5 µ (microns) to about 1.0 µ thick is formed over the TiW layer 25. The TiW metal layer 25 serves as a barrier layer preventing the Al layer 26 from interacting with the n+ layer 20. Other suitable refractory metals besides TiW may also be used.

The n+ layer 20, the TiW metal layer 25 and the Al layer 26 on the left side of the etch stopper 30 form the source electrode 37 of the TFT 35, and the n+ layer 20, the TiW metal layer 25 and the Al layer 26 on the right side of the etch stopper 30 form the drain electrode 38 of the TFT 35.

A silicon oxynitride (SiON) layer 40 which is about 0.5 µ to about 2.0 µ thick is formed over the TFT 35 having a via hole 45. A mushroom metal layer 62 is formed over the SiON layer 40 making physical and electrical contact with the drain electrode 38. Mushroom metal layer 62 may be comprised of chromium (Cr), may be a bi-layer with aluminum as a lower layer and chromium as an upper layer (Al/Cr), may be a tri layer with titanium as a lower layer, aluminum as an intermediate layer, and chromium as a top layer (Ti/Al/Cr), or be of other appropriate composition. Mushroom metal layer 62 will typically be on the order or 500-2000 Å (in some cases as thick as 800 nm). An n+ doped layer 55 which is about 500 Å to about 1000 Å thick is formed over mushroom metal 62. An undoped a-Si:H (amorphous silicon) layer 60 which is about 0.5 µ to about 2.0 µ thick is formed over the n+ doped layer 55. A p+ doped layer 65 which is about 100 Å thick is formed over the undoped a-Si:H layer 60, and a conductive layer 70 that is also transparent is formed over the p+ doped layer 65. For this embodiment the conductive layer 70 is an indium-tin-oxide (ITO) layer which is about 500 Å to about 1000 Å thick.

A SiON layer 75 which is about 0.5 µ to about 2.0 µ thick is formed over the conductive layer 70 having a via hole 80. A bias contact 90 is formed over the SiON layer 75 and contacts the conductive layer 70. For this embodiment, the bias contact is a layer of TiW about 500 Å thick beneath a layer of Al about 0.5 µ to about 1.0 µ thick. Finally, a passivation layer 95 which is about 0.5 µ to about 1.0 µ thick is formed over both the conductive layer 70 and the bias contact 90. The passivation layer 95 comprises but is not limited to an SiON layer.

During operation, the TFT 35 is turned OFF to allow the photodiode 99 to accumulate charge based on incident light. This accumulated charge is a received image signal. When a control signal is received from an external controller (not shown), the TFT 35 turns ON and transfers the accumulated charge of the photodiode 99 to the other components (not shown) that amplify and process the received image signal.

The photodiode 99 is biased by applying a voltage on the bias contact 90. The bias voltage induces an electric field in the a-Si:H layer 60. When light enters the a-Si:H layer 60, electron-hole pairs are generated. The electrons and holes are swept by the electric field to opposite sides of the photodiode 99 and accumulate near the photodiode electrode contacts, which are the conductive layer 70 and the n+ doped layer 55. When the TFT 35 is turned ON, the accumulated charges are allowed to flow as current through source electrode 37 to the other components.

Figure 2A:
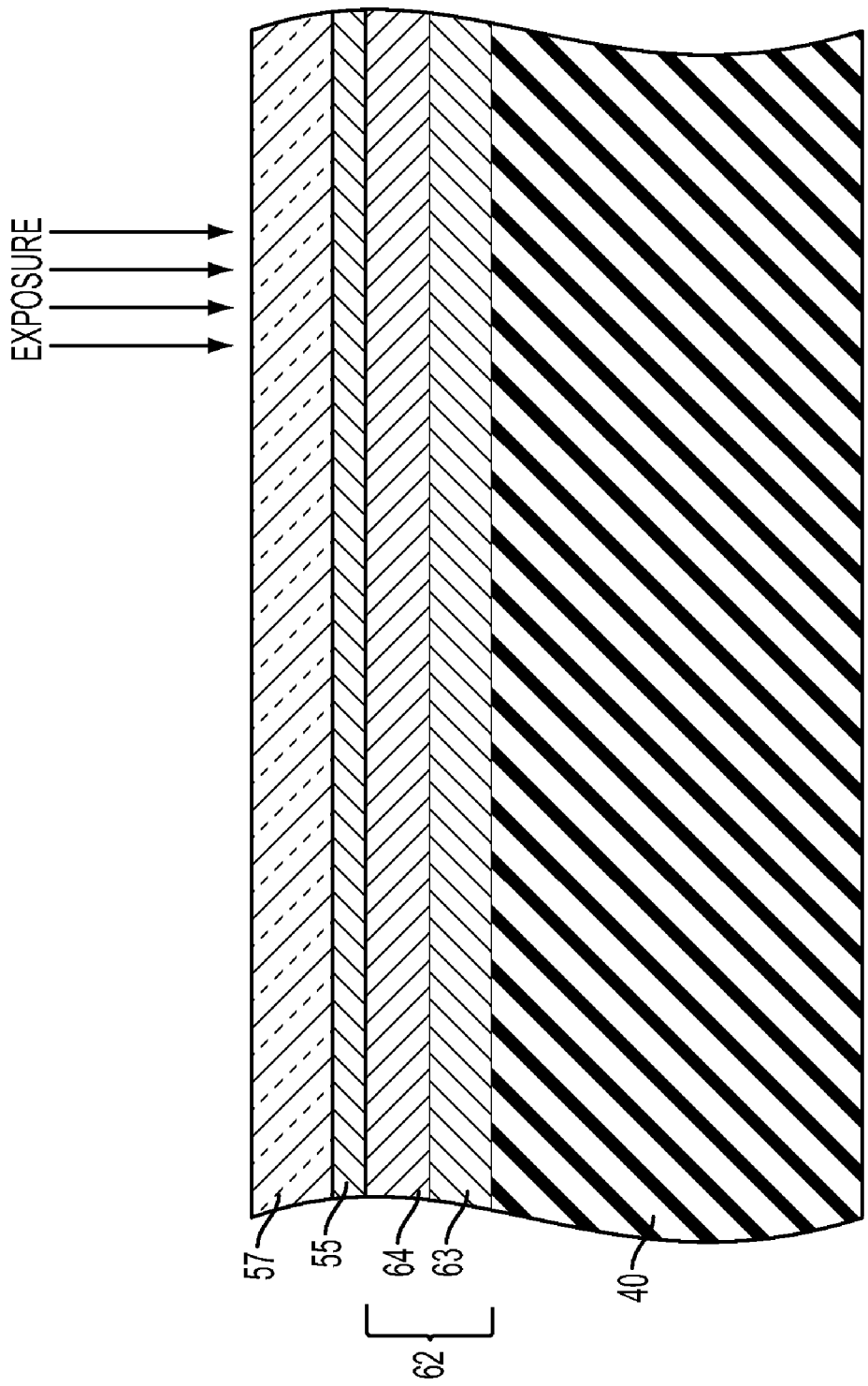
FIGS. 2A-2C are cross-sectional views showing the process of manufacturing a first embodiment of a photo-sensor structure according the present disclosure.
Figure 2B:
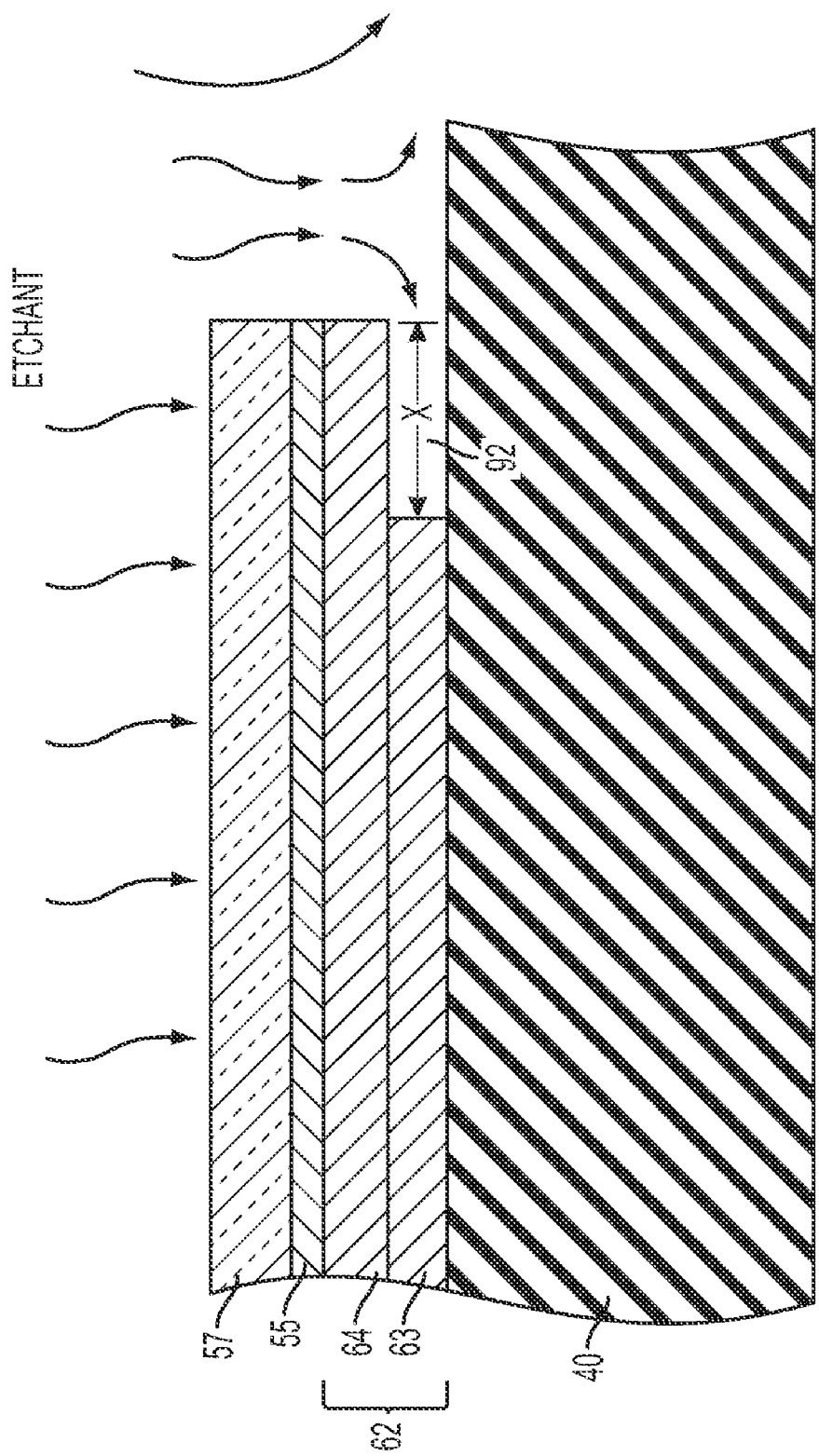
Figure 2C:
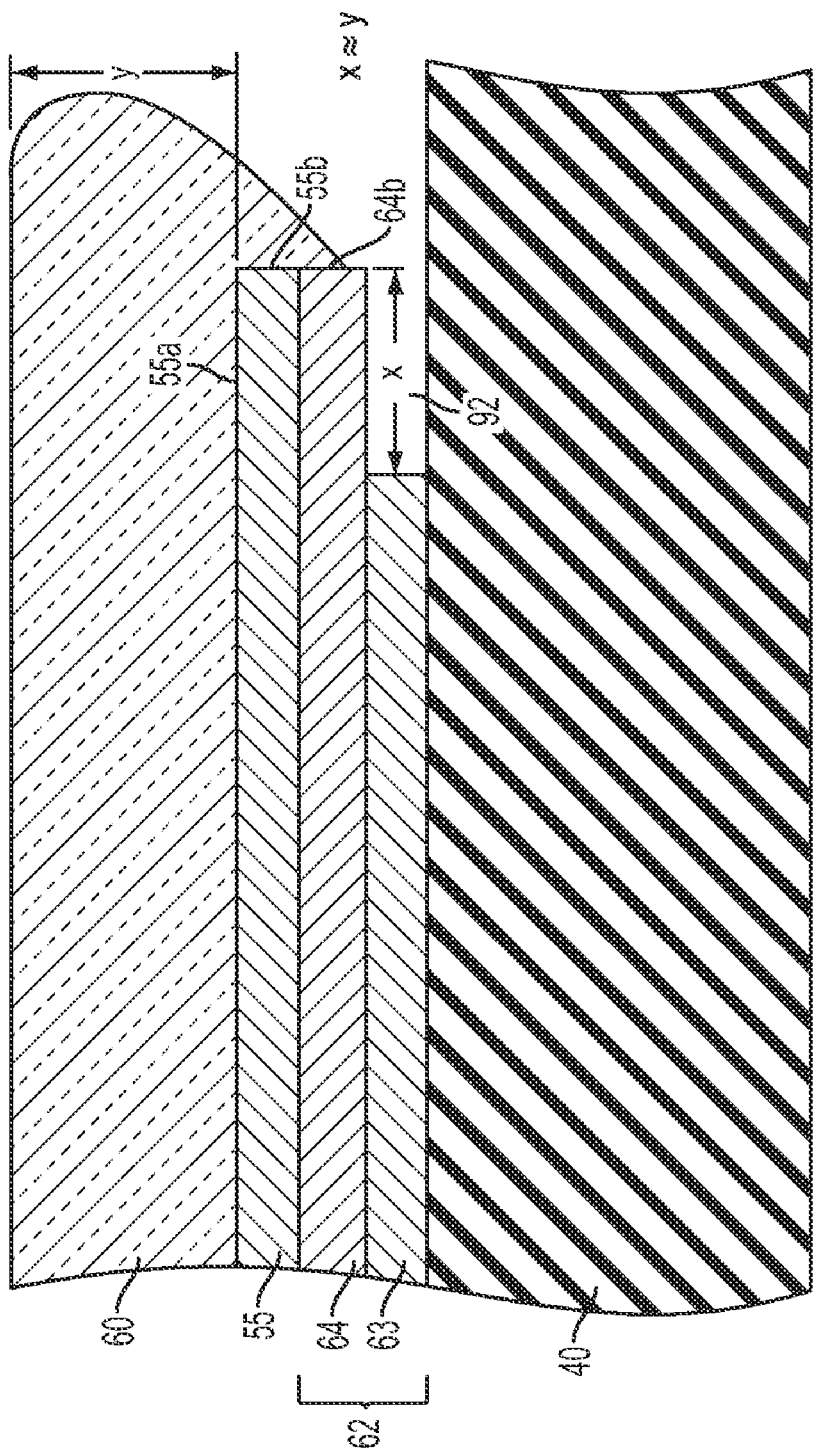

FIGS. 2A-2C is an illustration of the steps of forming device 4 such that an overhang region 92 is defined therein. With respect to FIG. 2A, the method begins with the formation of mushroom metal 62 over encapsulation layer 40 (it is assumed that an appropriate TFT structure has previously been formed below and within encapsulation layer 40, preferably on a flexible substrate). In this embodiment, mushroom metal layer 62 comprises a bi-layer, such as a layer 63 of Al below a layer 64 of Cr. Aluminum has low resistivity and therefore is used as an ohmic contact and as a conductor For interconnect bus lines between pixels within the array. However, aluminum has poor selectivity to oxide etchants, and easily oxidizes. The chrome cap layer therefore serves to prevent oxidation, over etching, etc. Accordingly, when an etchant is presented to the lateral edges of mushroom metal layer 62, its bi-layer composition presents two different etch rates, which may advantageously be employed as follows.

In the process of defining pixel-specific mushroom metal layer 62 and first doped sensor layer 55, a photosensitive material 54 is deposited over layer 55, which in turn is Selectively exposed to create regions of etch susceptibility to separate adjacent pixels. FIG. 2B illustrates the process of etching the exposed structure. Once exposed, a wet etch (or alternatively, a dry etch) process is employed to remove portions of layers 55 and 62 down to the encapsulation layer 40, which resists etching, as illustrated in FIG. 2B. In the process of this etch, lateral edges of the first doped sensor layer 55 and the layers comprising mushroom metal layer, for example aluminum 63 and chromium 64, are exposed to the etchant. Aluminum, with its poor selectivity to the etchant, will be removed laterally to a greater extent than the chromium and n+ a-Si:H material comprising first doped sensor layer 55. This creates overhang region 92. In a subsequent step, not shown, etch resist layer 57 is removed.

While the precise depth x of the overhang region is not critical, and is generally controlled by the etch parameters and material, as a general rule we have found it useful to form the overhang (or undercut) to have a depth approximately equal to the thickness y of layer 60(e.g., FIG. 2C). For example, if layer 60 is to be formed to a thickness of 1 µm, the target depth x of overhang 92 would be 1 µm. Other methods of forming overhang 92 may also be employed without modification of the benefits of its presence in the ultimate structure. Accordingly, the bi-layer and etch process described form just one exemplary embodiment of an aspect of the present disclosure.

As shown in FIG. 2C, once layers 62 and 55 are deposited and patterned, and overhang 92 defined, undoped (intrinsic) sensor layer 60 is next deposited. In one embodiment of the present disclosure, layer 60 is intrinsic a-Si:H deposited by plasma-enhanced chemical vapor deposition (PECVD). Additional layers (not shown) such as a second doped sensor layer, transparent contact layer, etc. may then be deposited as well known in the art.

Figure 3:
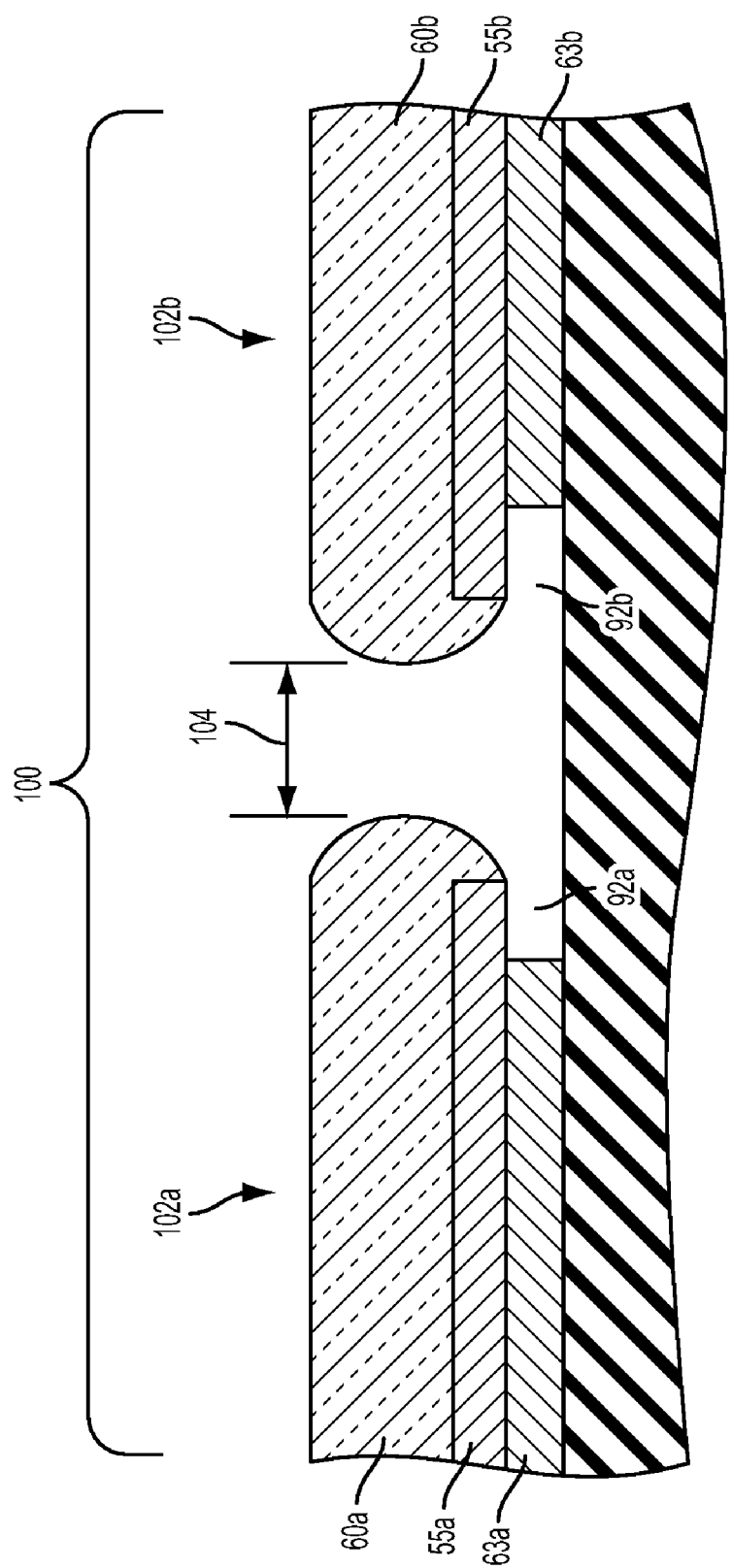
FIG. 3 is a cross-sectional view of a portion of an array of pixel structures showing an in-process formed gap providing physical and electrical separation between two partly-formed pixel structures according to an embodiment of the present disclosure.

We have discovered, that by providing a structure with overhang 92 as a base on which layer 60 is formed, the material comprising layer 60 attaches not only to the upper surface 55a of layer 55, but also to its lateral edge 55b as well at least a portion of lateral edge 64b of layer 64. Due to the deposition techniques used to form layer 60, very little if any of the material forming layer 60 enters overhang region 92. Thus, this region typically contains from virtually none to trace amounts of the material forming layer 60, with the term trace amount meaning generally an amount less than would result in the formation of an electrically conductive layer thereof. In the case of adjacent pixel structures, this means that layer 60 is formed as a discrete structure over each pixel, mechanically isolated from corresponding layers of adjacent pixels without requiring post-deposition patterning. This is illustrated in FIG. 3, showing two partly-formed pixel structures 102a, 102b forming a portion of an array 100 of such pixel structures separated by a gap 104 defined by the effect of the layers 60a, 60b forming as discrete structures. The width of gap 104 may vary, but in certain embodiments it ranges from 20 µm to 40 µm.

Figure 4:
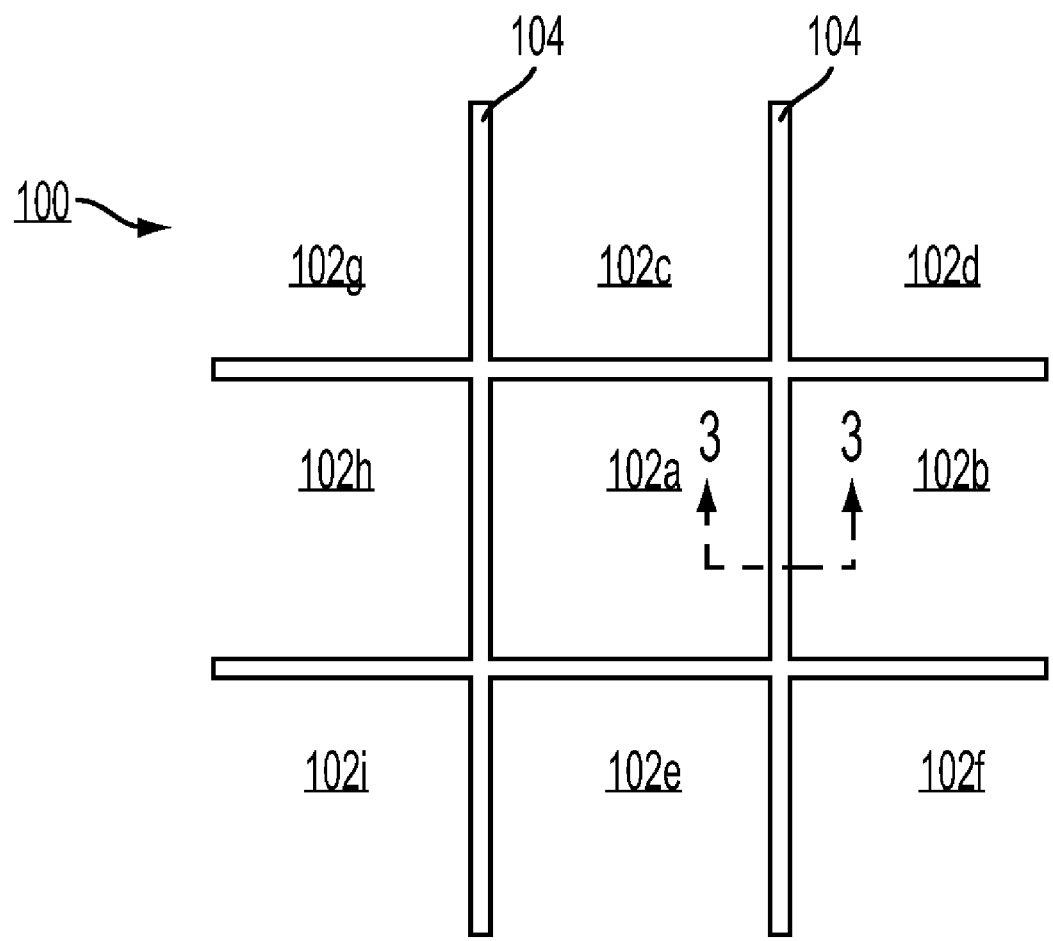
FIG. 4 is a plan-view of a portion of an array of pixel structures including the gap and two partly formed pixel structures of FIG. 3.

FIG. 4 shows a plan view of array 100 of adjacent photosensitive pixel structures 102a-102b, 102c-102d, 102e-102f, etc. Each pixel structure includes a p-i-n photodiode (layers 55-60-65, in FIG. 1) which is separated from adjacent p-i-n photodiodes by gaps 104. FIG. 3 represents a view of that portion of array 100 indicated by the cross-sectional line III-III.

Returning to FIG.3, the relatively significant thermal expansion and Contraction experienced by layers 60a, 60b during their manufacture (and similar layers for the other pixels in the array) may thus be tolerated due to their relatively small sizes (defined by gaps 104) without the cracking and failure typically observed when layer 60 is a continuous film. Furthermore, the electric charge generated in the photodiode 99 (FIG. 1) is prevented from dispersing to any of the neighboring photodiodes. Charge may therefore accumulate independently in each photodiode 99, thereby permitting high image sensing resolution.

Figure 5:
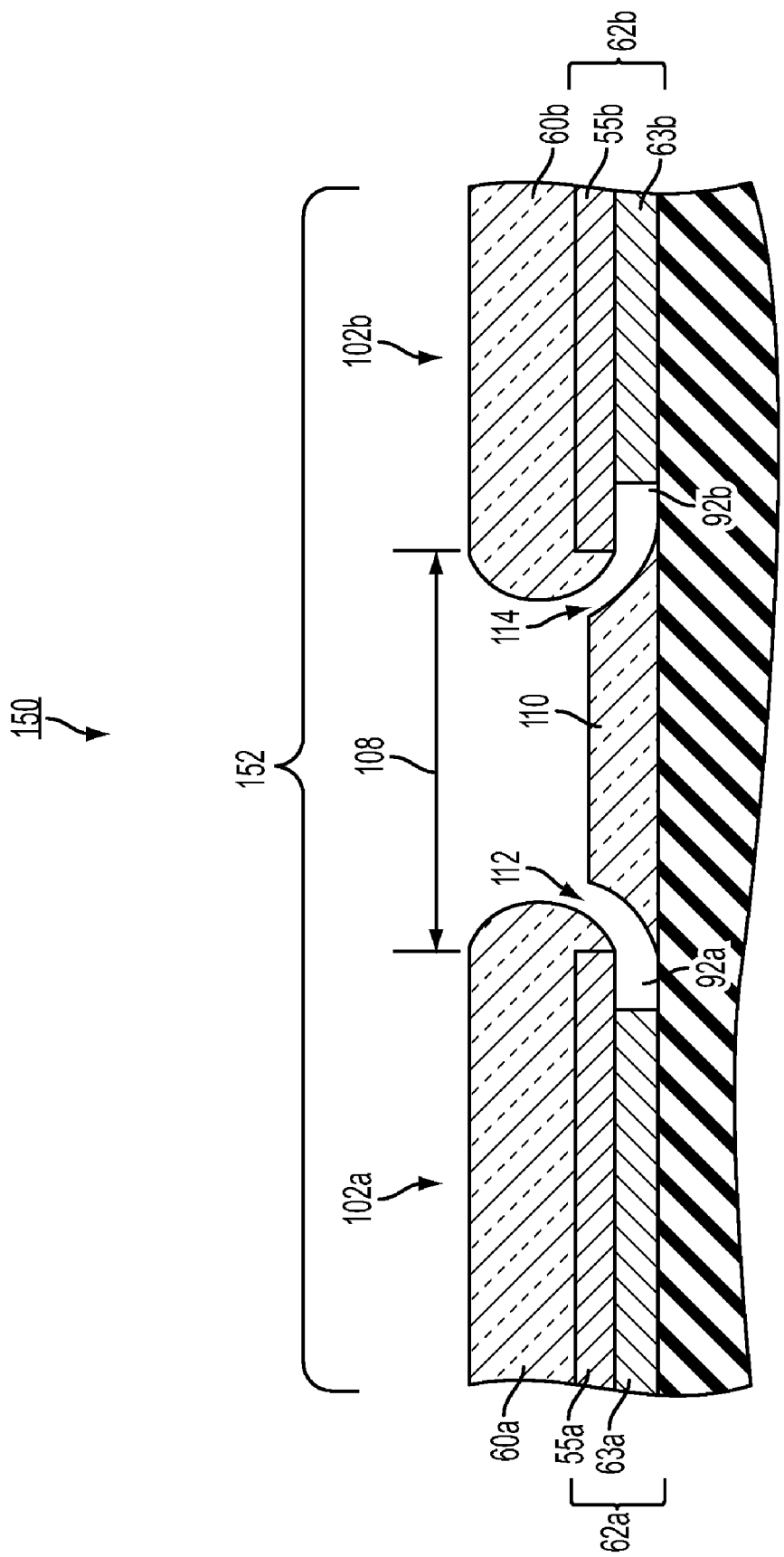
FIG. 5 is a cross-sectional view of a second embodiment of a photo-sensor structure according the present disclosure.

With reference to FIG. 5, another embodiment 150 of the present disclosure is illustrated. FIG. 5 shows a portion of an array 152 comprising two adjacent pixel structures 102a, 102b, of a structure and composition similar to that previously described. In this embodiment, the patterning of layer structures 63a, 63b, and 55a, 55b results in a relatively larger gap 108 between lateral edges of such layer structures. The size of gap 108 permits the material forming layers 60a, 60b, for example a-Si:H, to accumulate in the interstice between the lateral edges of layer structures 63a, 63b, and 55a, 55b, thereby forming a field structure 110 therein. It will be noted that in this embodiment a gap 112 between the layer structure 60a and field structure 110, and a similar gap 114 between layer structure 60b and field structure 110, provide physical isolation of the adjacent layer structures 60a and 60b to accommodate thermally-induced expansion and contraction, which also provides electrical solation for improved sensor resolution.

Figure 6:
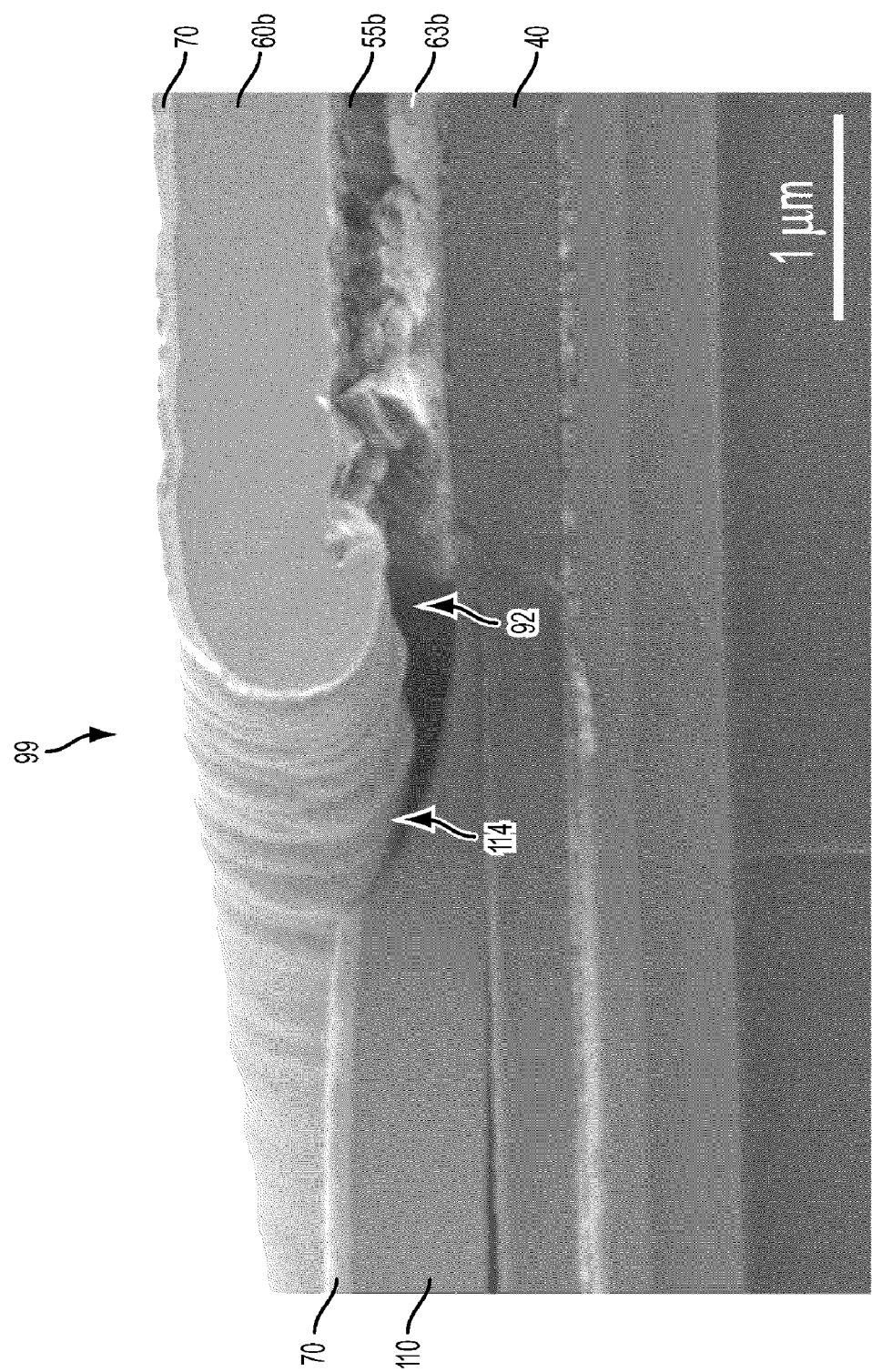
FIG. 6 is a micro-photograph of a cross-section of a partial sensor structure according an embodiment of the present disclosure.

FIG. 6 is a micro-photograph of a cross-section of a partial sensor structure According to the present disclosure. As can be seen from FIG. 6, gap 114 physically separates photodiode 99 from field structure 110. Based on this separation it is possible to form a relatively thick intrinsic layer 60b, in this embodiment on the order of 1 µm, without evident cracking or damage due to thermally-induced expansion or contraction.

While a plurality of preferred exemplary embodiments have been presented in the foregoing detailed description, it should be understood that a vast number of variations exist, and these preferred exemplary embodiments are merely representative examples, and are not intended to limit the scope, applicability or configuration of the disclosure in any way. Rather, the foregoing detailed description provides those of ordinary skill in the art with a convenient guide for implementation of the disclosure, by way of examples, and contemplates that various changes in the functions and arrangements of the described embodiments may be made without departing from the spirit and scope of the disclosure defined by the claims thereto.

What is claimed is:
1. A sensor structure comprising:
a flexible substrate;
a thin-film transistor formed over said flexible substrate, said thin-film transistor having a drain pad;
an encapsulation layer formed over said thin-film transistor, said encapsulation layer having a via formed therein;

a pixel metal layer patterned to generally overly said thin-film transistor and having a region extending into said via so as to make electrical contact with said drain pad, said pixel metal layer having a top surface and a lateral edge;

a first sensor layer in physical and electrical contact with said top surface of said pixel metal layer, said first sensor layer having a top surface and a lateral edge, said first sensor layer patterned such that its lateral edge extends beyond the lateral edge of said pixel metal layer to thereby define an overhang region; and a second sensor layer in physical and electrical contact with said top surface and said lateral edge of said first sensor layer, said second sensor layer physically and electrically isolated from any structures laterally adjacent thereto.

2. The sensor structure of claim 1, wherein said overhang region contains no more than trace amounts of a material which is conductive in a range of intended operating voltages of said thin-film transistor.

3. The sensor structure of claim 1, wherein said overhang region contains no more than trace amounts of a material from which said second sensor layer is formed.

4. The sensor structure of claim 1, further comprising a third sensor layer formed over and in contact with said second sensor layer, wherein said first, second, and third sensor layers together form a p-i-n sensor structure.

5. The sensor structure of claim 4, wherein said first and third sensor layers are doped amorphous silicon (a-Si:H), and said second sensor layer is intrinsic amorphous silicon (a-Si:H).

6. The sensor structure of claim 5, wherein said first sensor layer is n+ doped amorphous silicon (a-Si:H), and said third sensor layer is p+ doped amorphous silicon (a-Si:H).

7. The sensor structure of claim 1, wherein said pixel metal layer is comprised of a plurality of layers, each layer comprising a different material.

8. The sensor structure of claim 7, wherein said pixel metal layer comprises a bi-layer of aluminum and chromium.

9. The sensor structure of claim 7, wherein said pixel metal layer comprises a tri-layer of titanium, aluminum, and chromium.

10. The sensor structure of claim 1, wherein said overhang region has a lateral dimension approximately equal to the thickness of the second sensor layer.

11. A sensor structure of the type including a flexible substrate, a thin-film transistor formed on said substrate, an encapsulation layer formed over said thin-film transistor, and a p-i-n junction sensor structure including a lower sensor layer and an intrinsic sensor layer, formed over said encapsulation layer, comprising:

a pixel metal layer disposed between and in physical contact with said encapsulation layer and said p-i-n junction sensor structure, said pixel metal layer formed so as to extend a distance laterally that is less than a distance said lower sensor layer extends laterally, to thereby define an overhang region below said lower sensor layer and laterally adjacent said pixel metal layer; and said intrinsic sensor layer in physical and electrical contact with said lower sensor layer including lateral edges thereof, such that said intrinsic sensor layer is physically isolated from any laterally adjacent structures.

12. The sensor structure of claim 11, wherein said overhang region contains no more than trace amounts of a material which is conductive in a range of intended operating voltages of said thin-film transistor.

13. The sensor structure of claim 11, wherein said overhang region is contains no more than trace amounts of a material from which said intrinsic sensor layer is formed.

14. The sensor structure of claim 11, wherein lower sensor layer comprises doped amorphous silicon (a-Si:H) and said intrinsic sensor layer comprises intrinsic amorphous silicon (a-Si:H).

15. The sensor structure of claim 11, wherein said pixel metal layer is comprised of a plurality of layers, each layer comprising a different material.

16. The sensor structure of claim 15, wherein said pixel metal layer comprises a bi-layer of aluminum and chromium.

17. The sensor structure of claim 15, wherein said pixel metal layer comprises a tri-layer of titanium, aluminum, and chromium.

18. The sensor structure of claim 11, wherein said overhang region has a lateral dimension approximately equal to the thickness of the second sensor layer.

19. An array of a plurality of sensor structures formed on a flexible substrate, each said structure comprising:

a thin-film transistor formed on said flexible substrate;

an encapsulation layer formed over said thin-film transistor;

a p-i-n junction sensor structure including a lower sensor layer and an intrinsic sensor layer, formed over said encapsulation layer;

a pixel metal layer disposed between and in physical contact with said encapsulation layer and said p-i-n junction sensor structure, said pixel metal layer formed so as to extend a distance laterally that is less than a distance said lower sensor layer extends laterally, to thereby define an overhang region below said lower sensor layer and laterally adjacent said pixel metal layer;

whereby said intrinsic sensor layer is in physical and electrical contact with said lower sensor layer including lateral edges thereof, such that said intrinsic sensor layer is physically isolated from all other laterally adjacent sensor structures comprising said array.

20. The array of claim 19, further comprising a field sensor structure formed between and physically and electrically isolated from adjacent sensor structures.

21. The array of claim 19, wherein said field sensor structure comprises the same material as that of which said intrinsic sensor layer is formed.

* * * * *